United States Patent
Takahashi

(10) Patent No.: US 7,880,271 B2
(45) Date of Patent: Feb. 1, 2011

(54) SEMICONDUCTOR DEVICE WITH EMITTER CONTACT HOLES IN A FIRST LAYER NOT OVERLAID BY EMITTER THROUGH HOLES IN A SECOND LAYER

(75) Inventor: Kazuya Takahashi, Gunma (JP)

(73) Assignees: Sanyo Electric Co., Ltd, Osaka (JP); Sanyo Semiconductor Co., Ltd, Gunma (JP)

( * ) Notice: Subject to any disclaimer, the term of this patent is extended or adjusted under 35 U.S.C. 154(b) by 24 days.

(21) Appl. No.: 12/547,623

(22) Filed: Aug. 26, 2009

(65) Prior Publication Data

US 2010/0052102 A1    Mar. 4, 2010

(30) Foreign Application Priority Data

Aug. 26, 2008    (JP)    .............................. 2008-217105

(51) Int. Cl.
    *H01L 29/73*    (2006.01)
(52) U.S. Cl. ................................. 257/587; 257/E29.174
(58) Field of Classification Search .................. 257/587
    See application file for complete search history.

(56) References Cited

U.S. PATENT DOCUMENTS

2005/0212088 A1    9/2005    Akaki

2008/0265386 A1    10/2008    Muto et al.
2010/0052012 A1    3/2010    Takahashi

FOREIGN PATENT DOCUMENTS

| JP | 2000-40703 | 2/2000 |
| JP | 2005-285910 | 10/2005 |
| JP | 2005-285911 | 10/2005 |
| JP | 2005-285912 | 10/2005 |

OTHER PUBLICATIONS

Takahashi, U.S. Office Action mailed Oct. 12, 2010, directed to related U.S. Appl. No. 12/547,668; 9 pages.

*Primary Examiner*—Benjamin P Sandvik
*Assistant Examiner*—W. Wendy Kuo
(74) *Attorney, Agent, or Firm*—Morrison & Foerster LLP

(57) ABSTRACT

Emitter contact holes formed under emitter electrodes in a first layer and emitter through holes formed thereon are arranged so as not to overlap each other, and, for each emitter electrode, the multiple emitter contact holes and the multiple emitter through holes are provided so as to be separated from each other. Thereby, the top surface of an emitter electrode in a second layer is influenced by at most only a level difference of each emitter through hole formed in an insulating film having a larger thickness, and thus the flatness of the top surface of the emitter electrode in the second layer is improved. Accordingly, fixation failure of a metal plate can be avoided.

5 Claims, 8 Drawing Sheets

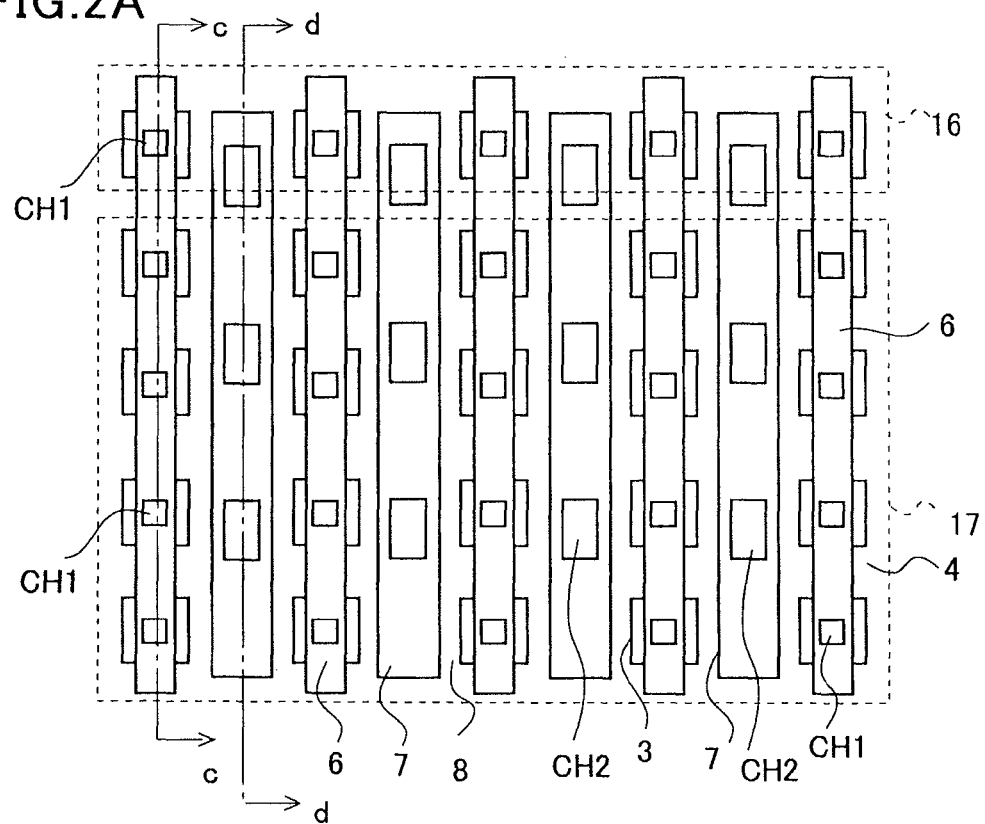
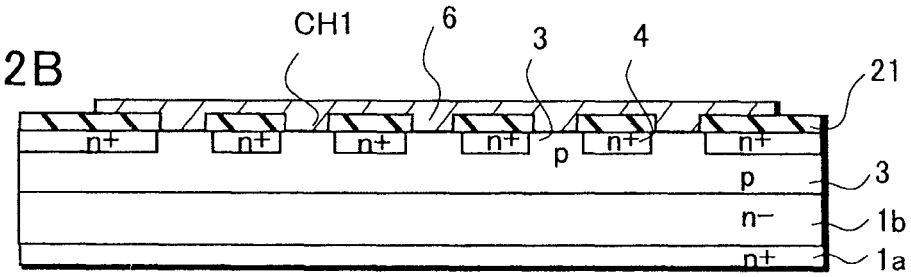
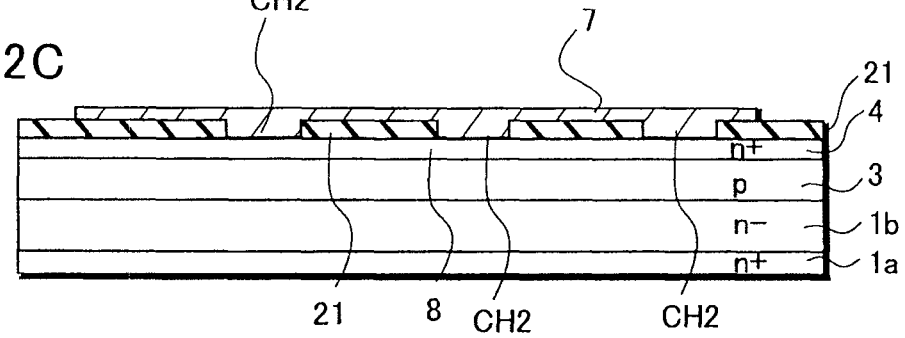

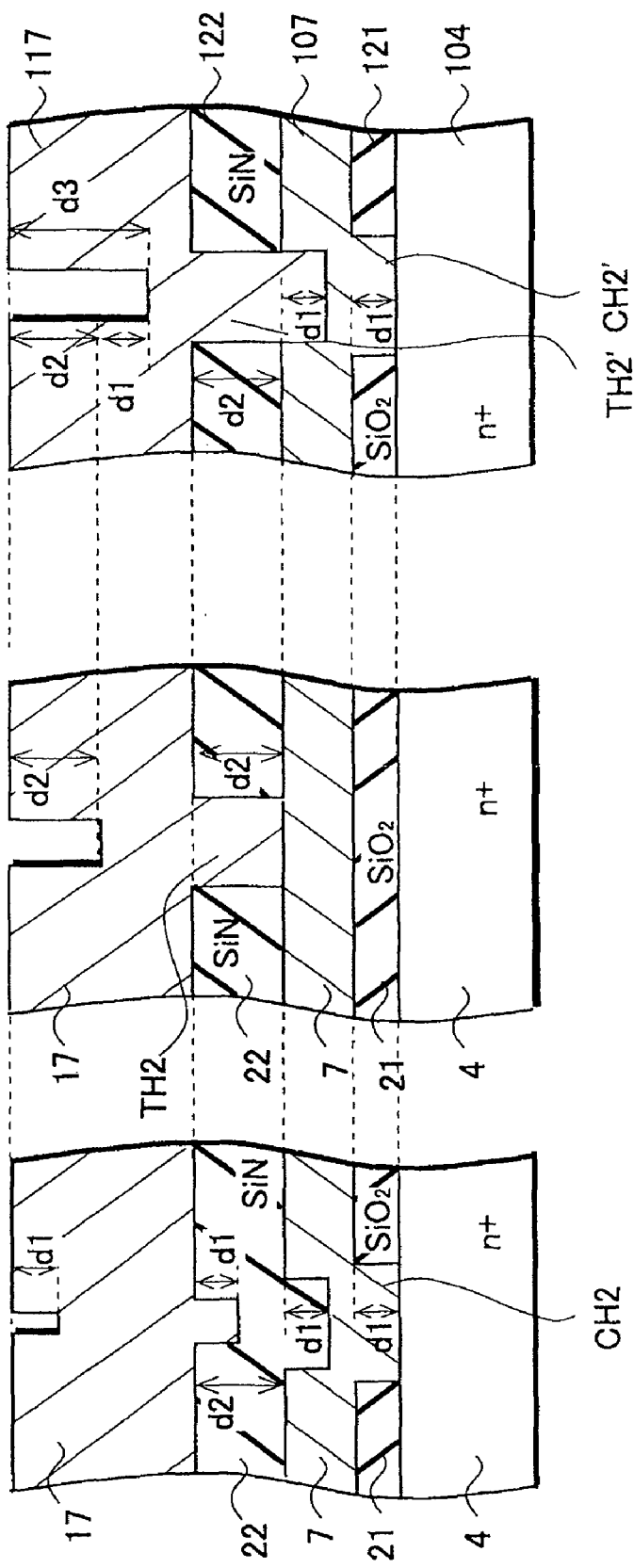

Prior Art

SEMICONDUCTOR DEVICE WITH EMITTER CONTACT HOLES IN A FIRST LAYER NOT OVERLAID BY EMITTER THROUGH HOLES IN A SECOND LAYER

This application claims priority from Japanese Patent Application Number JP 2008-217105 filed on Aug. 26, 2008, the content of which is incorporated herein by reference in its entirety.

BACKGROUND OF THE INVENTION

1. Field of the Invention

The present invention relates to a semiconductor device, specifically to a semiconductor device that includes a planarized electrode of transistors and a larger area of safety operation (ASO), and that is capable of avoiding thermal runaway, and of decreasing resistance components.

2. Description of the Related Art

As a discrete bipolar transistor, there has been known a bipolar transistor having a base electrode and an emitter electrode each formed in two layers on an operation region including an emitter region formed in a lattice form and base regions formed in islands. This technology is described for instance in Japanese Patent Application Publication No. 2000-40703.

With reference to FIG. 6, a conventional semiconductor device will be described taking npn type transistors as an example.

FIG. 6A is a plan view of an entire semiconductor device 100. FIG. 6B is a cross-sectional view taken along the line j-j in FIG. 6A, and FIG. 6C is a cross-sectional view taken along the line k-k in FIG. 6A. Note that the broken lines in FIG. 6A indicate electrodes in a second layer.

A collector region is provided by, for example, stacking an n− type semiconductor layer 51b on an n+ type silicon semiconductor substrate 51a. A base region 53, which is a p type impurity region, is provided on the top surface of the n− type semiconductor layer 51b. An emitter region 54 is formed by diffusing n type impurities in a lattice form in the top surface of the base region 53. Thereby, the base region 53 is separated into islands, which are arranged in the emitter region 54 in an alternating manner. Note that, specifically, only a superficial structure of the base region 53 is separated into the islands, and a deep region of the base region 53 that is deeper than the emitter region 54 remains a single continuous region. A transistor formed of one of the separate islands of the base region and a portion of the emitter region surrounding the island will be hereinafter referred to as a cell, and a region in which a large number of cells are arranged will be referred to as an operation region 58.

Each of base electrodes connected to the base regions 53 and emitter electrodes connected to the emitter region 54 has a two-layer structure. The base electrodes in a first layer are island-like first base electrodes 56a and stripe-like first base electrodes 56b, and are in contact with the base region 53 through contact holes CHB formed in a first insulating film 61. The island-like first base electrodes 56a are arranged in one of two regions obtained by dividing the operation region 58 substantially along the center line, and the strip-like first base electrodes 56b are arranged in the other region.

The first emitter electrode 57 is provided in a lattice form in a region between the first base electrodes 56a, 56b, and is in contact with the emitter region 54 through contact holes CHE formed in the first insulating film 61.

A second insulating film 62 is provided on the first base electrodes 56a, 56b, and the first emitter electrode 57. A plate-like second base electrode 66 and a plate-like second emitter electrode 67 constituting the second layer are provided on the second insulating film 62. The second base electrode 66 is in contact with the island-like first base electrodes 56a and one ends of the strip-like first base electrodes 56b via through holes THB formed in the second insulating film 62 (FIG. 6B). The second emitter electrode 67 is in contact with the first emitter electrode 57 via through holes THE formed in the second insulating film 62 (FIG. 6C). The plate-like second base electrode 66 has approximately the same area as the plate-like second emitter electrode 67. Bonding wires (not shown) made of a material such as gold (Au) are connected to the second base electrode 66 and the second emitter electrode 67.

As shown in FIG. 6C, under the second base electrode 66, collector currents flow to the second emitter electrode 67 through the first emitter electrode 57 under the second base electrode 66. The problem here is that long current paths CP2', CP3' to the second emitter electrode 67 have a higher resistance than current paths CP1' under the second emitter electrode 67 because the electrode in the first layer (the first emitter electrode 57) has a smaller thickness than the electrode in the second layer (the second emitter electrode 67).

This causes the problem that most of the collector currents tend to flow through the current paths CP1' and thus leads to non-uniform current density of the chip. The non-uniform current density increases the risk of thermal runaway, which leads to a problem of reducing the size of ASO. Additionally, the non-uniform current density might prevent some of cells from being activated when the semiconductor device 100 is turned on, which leads to the problem of further increasing resistance components and thus further increasing the non-uniformity of the current density.

SUMMARY OF THE INVENTION

The invention provides a semiconductor device that includes a semiconductor substrate of a first general conductivity type configured to operate as a collector region, a base region of a second general conductivity type formed on the substrate, an emitter region of the first general conductivity type formed in a surface portion of the base region to form a lattice pattern so that islands of the base region are defined in the surface portion by the lattice pattern as a matrix in plan view of the semiconductor device, a first insulating film disposed on the emitter region and the islands of the base region and having a plurality of base contact holes standing on corresponding islands of the base region and a plurality of emitter contact holes standing on the emitter region, and a plurality of first base electrodes of a strip form. Each of the first base electrodes is disposed on and in contact with a column of the islands of the matrix through corresponding base contact holes. The device also includes a plurality of first emitter electrodes of a strip form. Each of the first emitter electrodes is disposed on and in contact with the emitter region through corresponding emitter contact holes. The device further includes a second insulating film disposed on the first base electrodes and the first emitter electrodes and having a plurality of base through holes standing on base contact holes that are located at ends of the columns of the matrix and a plurality of emitter through holes that do not overlap the emitter contact holes in the plan view of the semiconductor device, a second base electrode disposed on the second insulating film so as to overlay the base through holes and be electrically in contact with the first base electrodes through the base through holes, a second emitter electrode disposed on the second insulating film so as not to overlay the base through holes and be electrically in contact with the first emitter electrodes through the emitter through holes. The second base electrode is smaller than the second emitter electrode.

BRIEF DESCRIPTION OF THE DRAWINGS

FIGS. 2A to 2C are a plan view and cross-sectional views, respectively, for illustrating the preferred embodiment of the invention.

FIGS. 5A to 5C are cross-sectional views for comparing the preferred embodiment of the invention with a conventional art.

DETAILED DESCRIPTION OF THE INVENTION

The inventors came up with a conceivable solution for the problems discussed above. That is a semiconductor device 150 having a structure which includes a second emitter electrode having an increased area and a metal plate employed as an external connection.

Figure 7A:
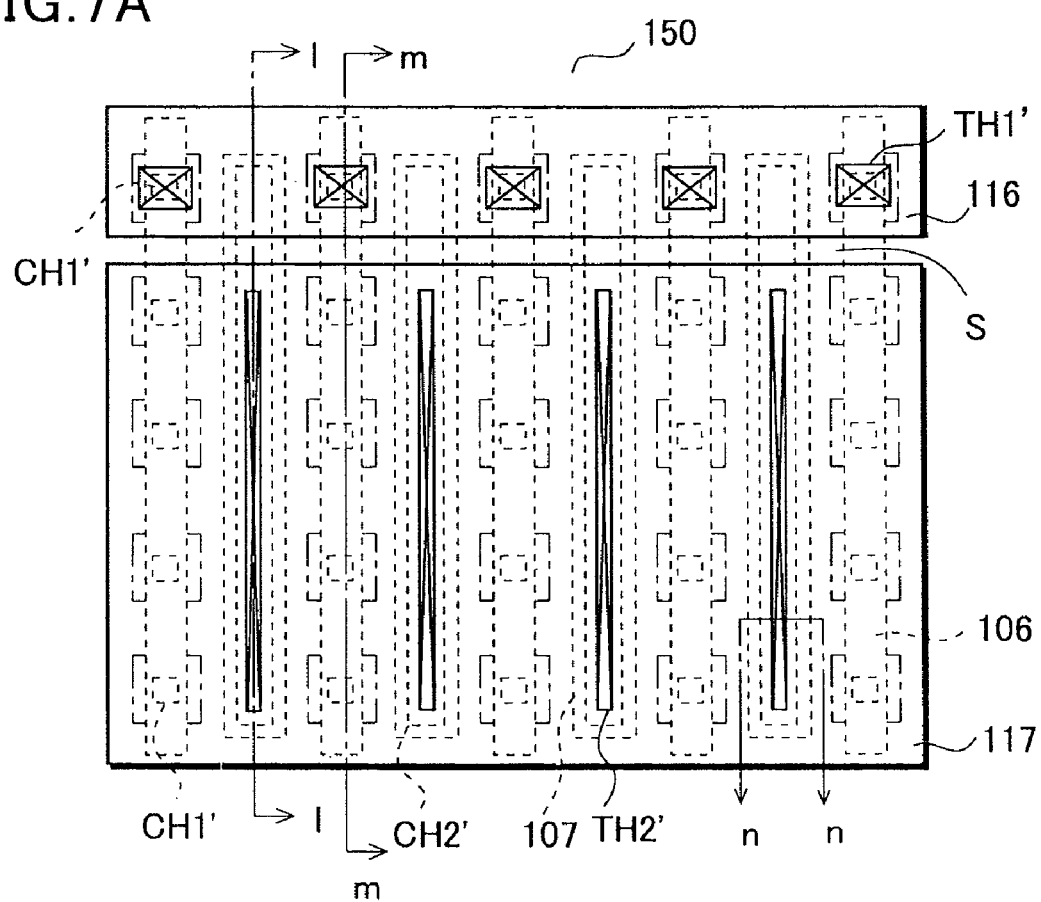
FIGS. 7A and 7B are a plan view and a cross-sectional view, respectively, for illustrating a conceivable solution.

FIGS. 7A to 8B show an example of the semiconductor device 150 of the conceivable solution including the second emitter electrode having an increased area. FIG. 7A is a plan view, FIG. 7B is a cross-sectional view taken along the line l-l in FIG. 7A, and FIG. 8A is a cross-sectional view taken along the line m-m in FIG. 7A. Note that the external connection is omitted in FIG. 7A.

A collector region is provided by stacking an n− type semiconductor layer 101b on a high-density n+ type semiconductor substrate 101a. A p type base region 103 (dashed-dotted lines) is provided on the top surface of the collector region. An n+ type emitter region 104 is formed in a lattice form in the top surface of the base region 103. Thereby, the base region 103 is separated into islands that have the same shape and area as each other, and that are arranged in a matrix form on a semiconductor substrate (chip).

An electrode structure in a first layer indicated by the broken lines is as follows. A first insulating film 121 (refer to FIG. 7B) is provided on the top surface of an operation region 108 (the base region 103 and the emitter region 104). First base electrodes 106 and first emitter electrodes 107 are provided on the first insulating film 121. The first base electrodes 106 are provided in strips, and are each connected to the multiple islands of the base region 103 thereunder. The first emitter electrodes 107 are also provided in strips, and are connected to the emitter region 104. The first base electrodes 106 and the first emitter electrodes 107 are alternately arranged in parallel with each other.

Base contact holes CH1' for the base region 103 and emitter contact holes CH2' for the emitter region 104 are formed in the first insulating film 121. Under each of the first base electrodes 106, the multiple base contact holes CH1' are formed in the first insulating film 121 so as to be separated from each other and to overlap the islands of the base region 103. Under each of the first emitter electrodes 107, the emitter contact hole CH2' is formed in a strip so as to overlap the first emitter electrode 107.

A second insulating film 122 (refer to FIG. 7B) is provided on the first base electrodes 106 and the first emitter electrodes 107. A plate-like second base electrode 116 and a plate-like second emitter electrode 117 are provided on the second insulating film 122. Under the second base electrode 116, only base through holes TH1' are formed in the second insulating film 122. Under the second emitter electrode 117, only emitter through holes TH2' are formed in the second insulating film 122. One ends of the multiple first base electrodes 106 are in contact with the plate-like second base electrode 116 via the base through holes TH1' (refer to FIG. 8A).

The second emitter electrode 117 is in contact with the first emitter electrodes 107 via the emitter through holes TH2' each overlapping the first emitter electrode 107 in the same column. The second emitter electrode 117 has a larger area than the second base electrode 116. A metal plate 131 serving as an external connection is fixed on the top surface of the second emitter electrode 117 with a conductive adhesive such as solder 130.

Accordingly, the region having low-resistance current paths such as CP1' and CP2' is increased in size while the region having high-resistance current paths such as CP3' is reduced in size, which can suppress current concentration. In addition, resistance reduction in the emitter electrode portions is achieved by using the metal plate 131 as the external connection.

Figure 7B:
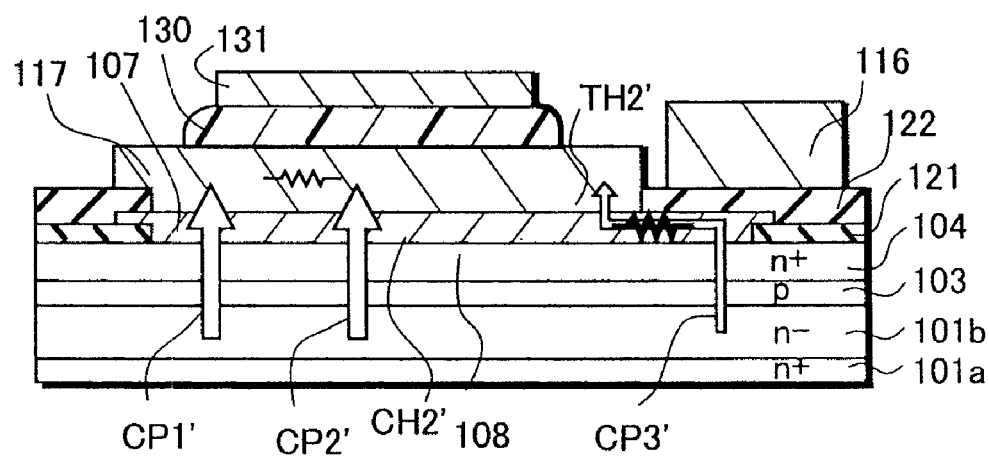

However, in the structure shown in FIGS. 7A and 7B, the top surface of the second emitter electrode 117 is more uneven, and thus has a poor wettability for the solder 130. Accordingly, the structure has the problem that the metal plate 131 cannot be favorably fixed on the surface.

Figure 8A:
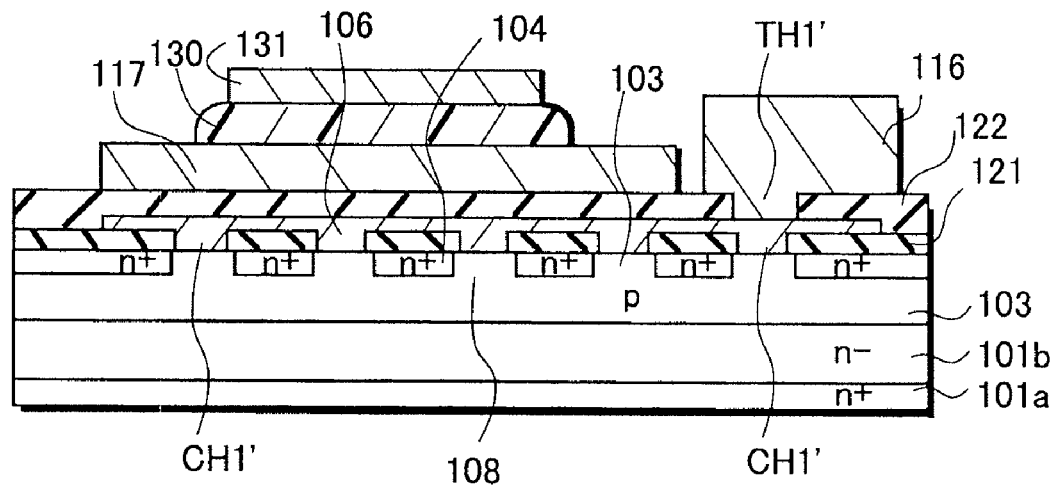
FIGS. 8A and 8B are cross-sectional views for illustrating the conceivable solution.
Figure 8B:
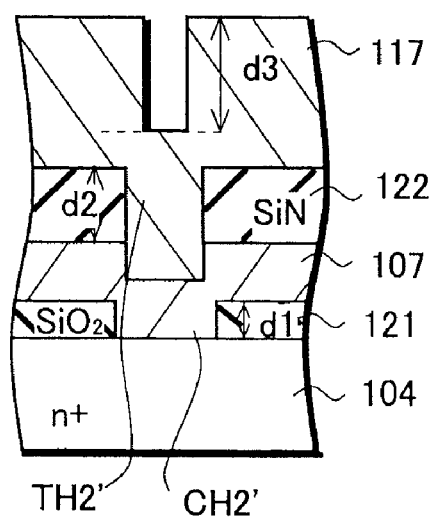

FIG. 8B is a cross-sectional view taken along the line n-n in FIG. 7A.

On each of the strip-like first emitter electrodes 107, the emitter through hole TH2' is formed in the second insulating film 122 so as to overlap the emitter contact hole CH2' formed in the first insulating film 121.

Specifically, the emitter contact holes CH2' are formed in the first insulating film 121 between the top surface of the substrate and the electrodes in the first layer, and the emitter through holes TH2' are formed in the second insulating film 122 between the electrodes in the first layer and the electrodes in the second layer. Accordingly, the overlapping portion of each emitter contact hole CH2' and the corresponding emitter through hole TH2' has a level difference d3 (=d1+d2), which is equivalent to a sum of a thickness d1 of the first insulating film 121 and a thickness d2 of the second insulating film 122. This level difference is as much as 3 μm, for example, and thus causes a large level difference in the top surface of the second emitter electrode 117 formed on the second insulating film 122. This causes a problem of reducing the wettability of the top surface of the second emitter electrode 117 for the solder 130 applied thereon, which leads to fixation failure of the metal plate 131.

A preferred embodiment of the present invention will be described in detail with reference to FIGS. 1A to 5C. In this embodiment, a semiconductor device 10 will be described taking npn type bipolar transistors, which are discrete elements, as an example.

Figure 1A:
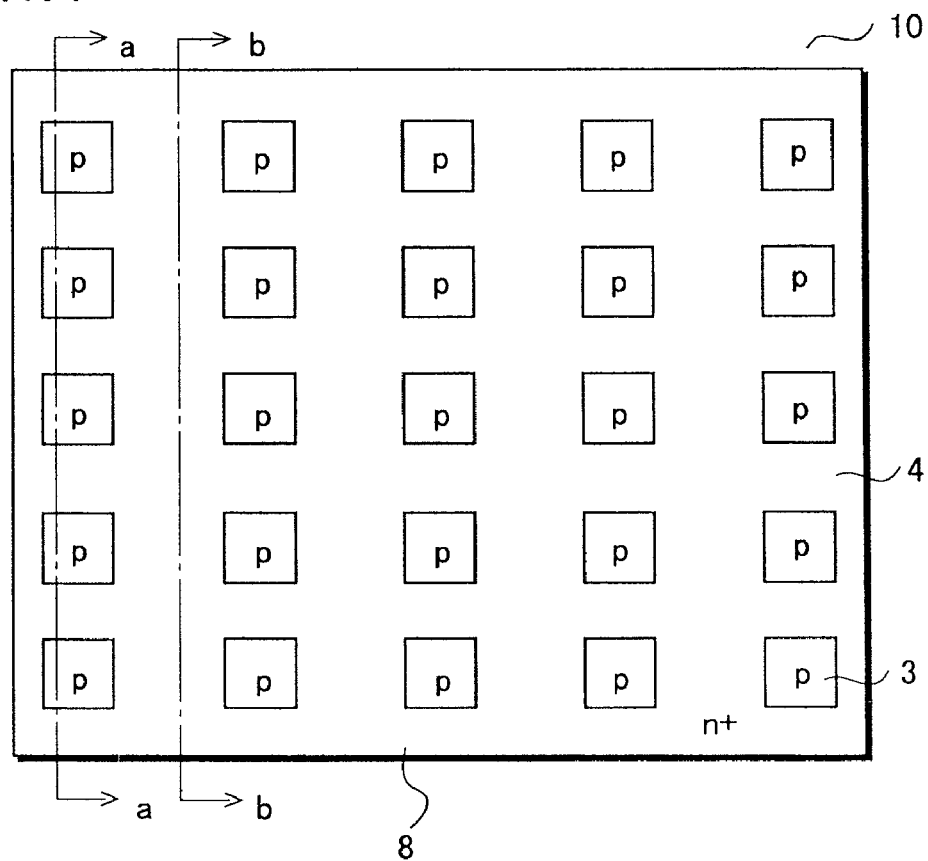
FIGS. 1A to 1C are a plan view and cross-sectional views, respectively, for illustrating a preferred embodiment of the invention.
Figure 1B:
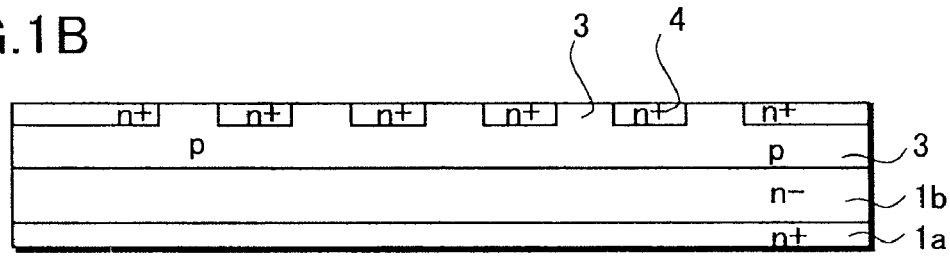
Figure 1C:
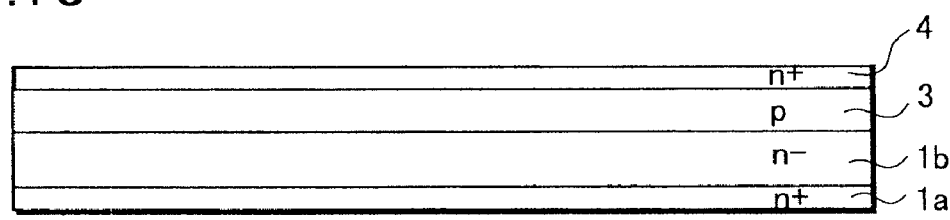

FIGS. 1A to 1C show a structure of the semiconductor device 10 according to the embodiment. Specifically, FIGS.

1A to 1C are a plan view, a cross-sectional view taken along the line a-a in FIG. 1A, and a cross-sectional view taken along the line b-b in FIG. 1A, respectively, and all show an operation region 8 of the semiconductor device 10.

The semiconductor device 10 includes a semiconductor substrate 1 of one conductivity type, a base region 3, an emitter region 4, a first insulating film 21, base contact holes CH1, emitter contact holes CH2, first base electrodes 6, first emitter electrodes 7, a second insulating film 22, base through holes TH1, emitter through holes TH2, a second emitter electrode 17, a second base electrode 16, a conductive adhesive 30, and a metal plate 33.

A semiconductor substrate 1 is formed by providing an n−type semiconductor layer 1b on a high-density n+ semiconductor substrate la by a method such as epitaxial growth, and serves as a collector region of the bipolar transistors.

A base region 3 is a p type diffusion region provided on the top surface of the collector region. An emitter region 4 is formed by diffusing n+ type impurities in a lattice form in the top surface of the base region 3. Thereby, the base region 3 is separated into islands shown in squares in FIG. 1A. Note that, specifically, only a superficial structure of the base region 3 is separated into the islands, and a deep region of the base region 3 that is deeper than the emitter region 4 remains a single continuous region (FIG. 1C). A large number of cells each formed of one of the separate islands of the base region 3 and a portion of the emitter region 4 surrounding the island are arranged to constitute an operation region 8. In this embodiment, the base region 3 is separated into islands that have the same shape and area as each other, and that are arranged in a matrix form on the semiconductor substrate (chip), the base regions having the same shape and area.

It is noted that conductivity types such as n+, n and n− belong in one general conductivity type and conductivity types such as p+, p and p− belong in the other general conductivity type.

FIGS. 2A to 2C are a plan view, a cross-sectional view taken along the line c-c in FIG. 2A, and a cross-sectional view taken along the line d-d in FIG. 2A, respectively, and all show an electrode structure in a first layer and the operation region 8. Note that the broken lines in FIG. 2A indicate electrodes in a second layer.

As shown in FIG. 2A, the first insulating film (not shown in FIG. 2A) is provided on the top surface of the operation region 8 (the base region 3 and the emitter region 4), and first base electrodes 6 and first emitter electrodes 7 are provided on the first insulating film.

The first base electrodes 6 are provided in strips, and are each connected to the multiple islands of the base region 3. Each of the first base electrodes 6 extends across a column or a row (column in this embodiment) of the islands of the base region 3 (and portions of the emitter region 4 between these islands) arranged in a direction parallel to a side of the semiconductor substrate (chip). Thus, the first base electrode 6 is in contact with all the islands of the base regions 3 across which the first base electrode 6 extends.

The first emitter electrodes 7 are also provided in strips, and are connected to the emitter region 4. Unlike the emitter region 4, which is formed in a lattice form (FIG. 1A), the first emitter electrodes 7 extend only in the direction parallel to the side of the semiconductor substrate 1. In other words, the first base electrodes 6 and the first emitter electrodes 7 are alternately arranged in parallel with each other.

As shown in FIGS. 2B and 2C, base contact holes CH1 for the base region 3 and emitter contact holes CH2 for the emitter region 4 are formed in a first insulating film 21. Under each of the first base electrodes 6, the multiple base contact holes CH1 are formed in the first insulating film 21 so as to be separated from each other and to overlap the islands of the base regions 3. All the base contact holes CH1 are of the same size and, for example, in a rectangular shape. Each of the first base electrodes 6 is in contact with portions of the base region 3 that are respectively exposed through the multiple base contact holes CH1 (FIG. 2B).

Under each of the first emitter electrode 7, the multiple emitter contact holes CH2 are formed in the first insulating film 21 so as to be separated from each other and to overlap the first emitter electrode 7. All the emitter contact holes CH2 are of the same size and, for example, in a rectangular shape. Each of the first emitter electrodes 7 is in contact with portions of the emitter region 4 that are respectively exposed through the multiple emitter contact holes CH2 under the first emitter electrode 7 (FIG. 2C).

Figure 3A:
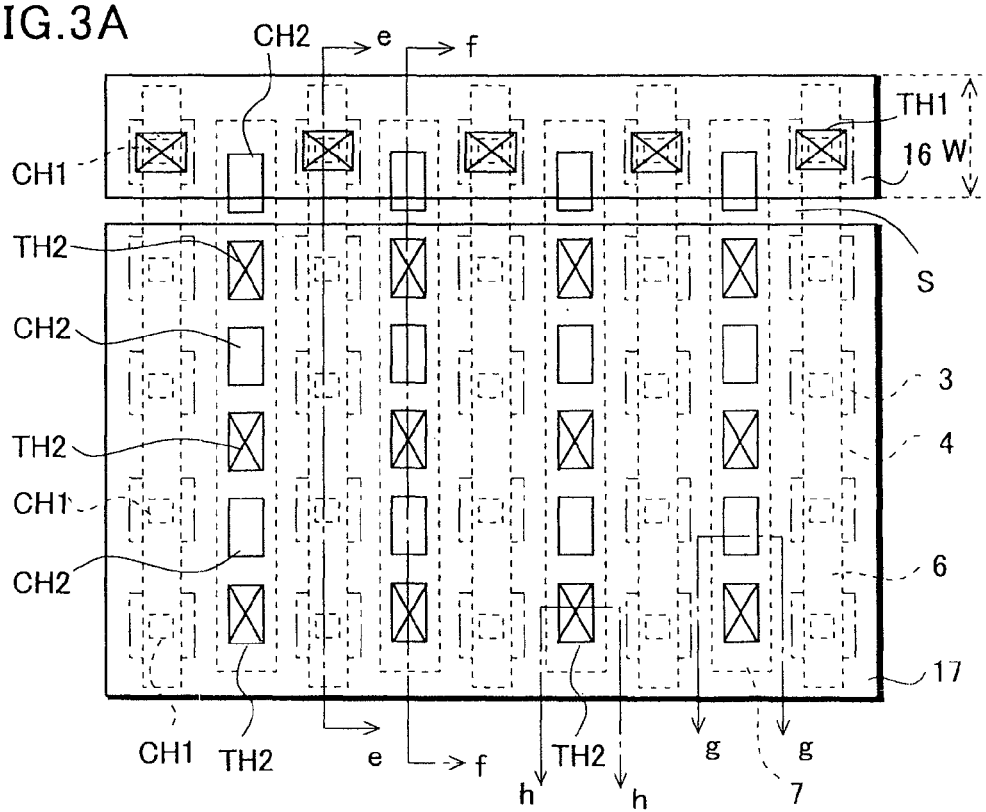
FIGS. 3A to 3C are a plan view and cross-sectional views, respectively, for illustrating the preferred embodiment of the invention.
Figure 3B:
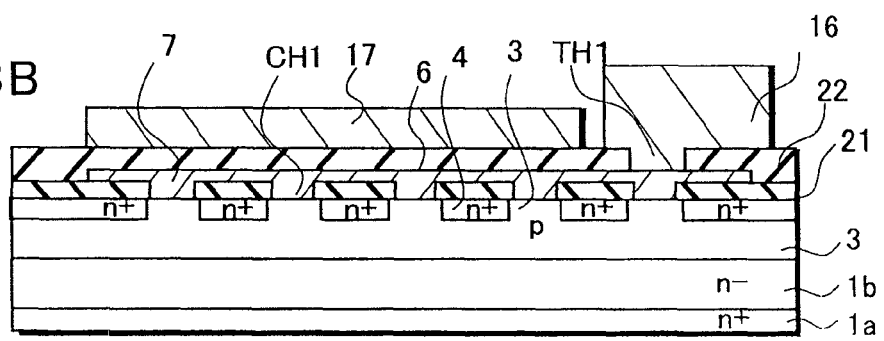
Figure 3C:
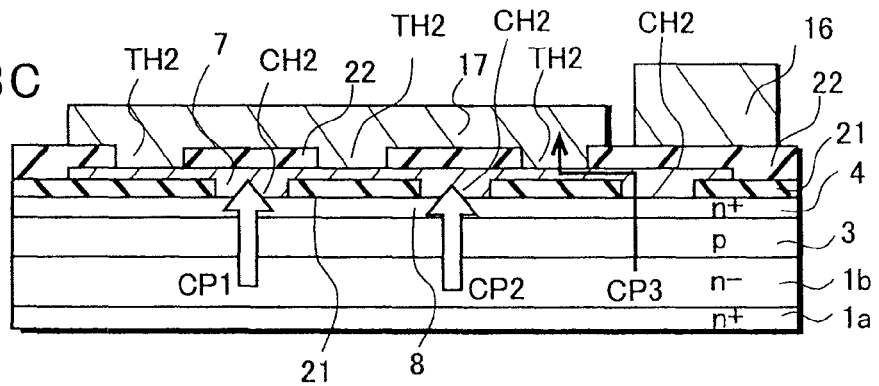

FIGS. 3A to 3C are a plan view, a cross-sectional view taken along the line e-e in FIG. 3A, and a cross-sectional view taken along the line f-f in FIG. 3A, respectively, and all show an electrode structure in a second layer. Note that, in FIG. 3A, the broken lines indicate the first base electrodes 6 and the first emitter electrodes 7 in the first layer, and the dashed-dotted lines indicate the base region 3.

As shown in FIG. 3A, the second insulating film (not shown in FIG. 3A) is provided to cover the first base electrodes 6 and the first emitter electrodes 7, and a plate-like second base electrode 16 and a plate-like second emitter electrode 17 are provided on the second insulating film.

The second base electrode 16 is connected to the multiple first base electrodes 6. Specifically, in this embodiment, the second base electrode 16 extends in the row direction so as to cover one ends of all the first electrodes 6 and the first emitter electrodes 7 arranged on the semiconductor substrate (chip), and is in contact with the one ends of all the first base electrodes 6.

The second emitter electrode 17 is provided adjacent to the second base electrode 16, and is connected to the first emitter electrodes 7. Specifically, the second emitter electrode 17 covers most of the remaining portions of all the first base electrodes 6 and the first emitter electrodes 7 arranged on the semiconductor substrate (chip), and is in contact with all the first emitter electrodes 7.

A boundary portion S is provided between the second base electrode 16 and the second emitter electrode 17, which are thus separated from each other by a predetermined distance of approximately 30 μm. The boundary portion S extends in a direction perpendicular to the extending direction of the first base electrodes 6 and the first emitter electrodes 7.

As shown in FIGS. 3B and 3C, base through holes TH1 and emitter through holes TH2 are formed in a second insulating film 22.

Under the second base electrode 16, only the base through holes TH1 are formed in the second insulating film 22. Specifically, for each first base electrode 6 extending in the column direction, one of the base through holes TH1 in a rectangular shape is formed, and the one ends of the multiple first base electrodes 6 are in contact with the plate-like second base electrode 16 via the base through holes TH1. In other words, as shown in FIG. 3B, the islands of the base region 3 under the second base electrode 16 are directly connected to the second base electrode 16 and the first base electrodes 6 arranged on the base region 3, through the base contact holes CH1 and the base through holes TH1 that overlap the respective islands.

Under the second emitter electrode 17, only the emitter through holes TH2 are formed in the second insulating film 22. Specifically, the multiple emitter through holes TH2 in a rectangular shape are formed so as to overlap one of the first emitter electrodes 7 extending in the column direction, and the first emitter electrodes 7 are in contact with the plate-like second emitter electrode 17 via the emitter through holes TH2. The multiple emitter through holes TH2 are arranged for each of the first emitter electrodes 7, and all the emitter through holes TH2 are of the same size. Note that, in FIG. 3A, though the emitter contact holes CH2 as well as the emitter through holes TH2 (and the base through holes TH1) are indicated by the solid lines for illustration purposes, the emitter contact holes CH2 are formed in the first insulating film 21, in which the base contact holes CH1 indicated by the broken lines are also formed.

In this embodiment, the emitter through holes TH2 formed in the second insulating film 22 on each of the first emitter electrodes 7 and the emitter contact holes CH2 formed in the first insulating film 21 under the first emitter electrode 7 are arranged so as not to overlap each other.

Specifically, the multiple emitter contact holes CH2 and the multiple emitter through holes TH2 for each of the first emitter electrodes 7 are alternately arranged so as to be separated from each other in a plane pattern shown in FIG. 3A. Here, the first emitter electrode 7 is in contact with the emitter region 4 via these emitter contact holes CH2, and is in contact with the second emitter electrode 17 via these emitter through holes TH2. This arrangement can improve the flatness of the top surface of the second emitter electrode 17, and descriptions of this will be given later.

The area of the second base electrode 16 is not more than a third of the area of the second emitter electrode 17. More preferably, the second base electrode 16 should have the smallest possible area (a width W of 60 µm to 100 µm, for example: refer to FIG. 3A) with room for wire bonding. Here, one or more bonding wires 34 need only to be fixed at different points on the top surface of the second base electrode 16. Thereby, the area of the second emitter electrode 17 can be increased compared with the conventional art.

Figure 6A:
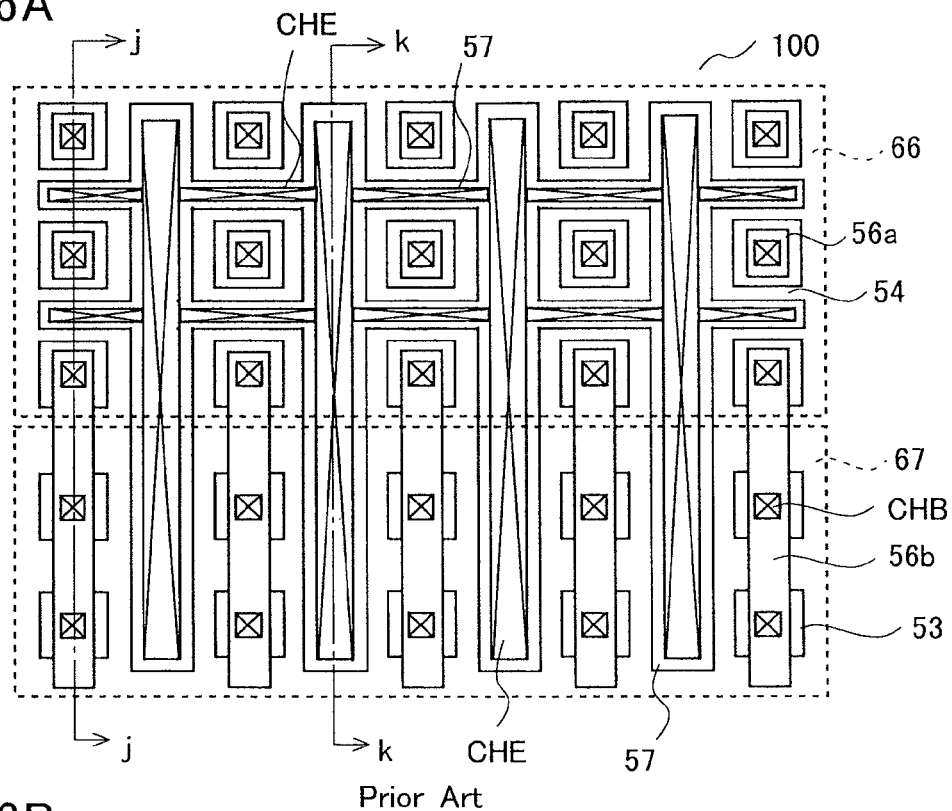
FIGS. 6A to 6C are a plan view and cross-sectional views, respectively, for illustrating the conventional art.
Figure 6B:
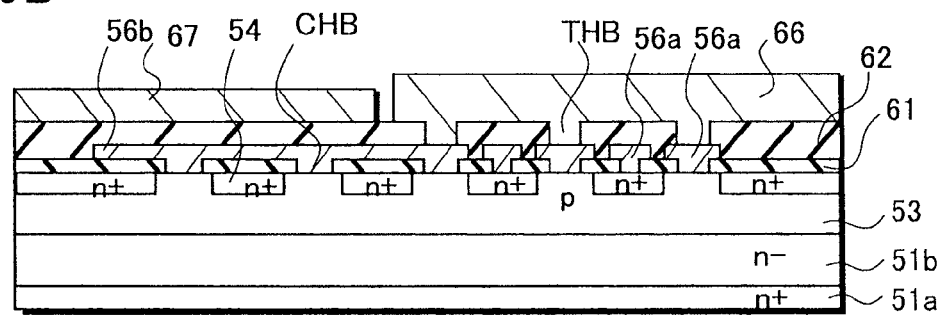
Figure 6C:
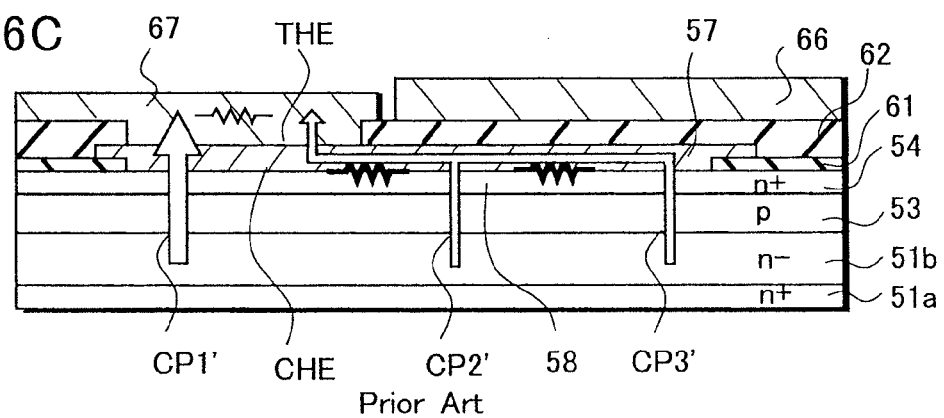

In the conventional semiconductor device (refer to FIG. 6), at least part of the first emitter electrode is provided in a lattice form. By contrast, in this embodiment, all the first emitter electrodes 7 are provided in strips, and thus the area of the second emitter electrode 17 can be increased to the maximum.

As shown in FIG. 3C, by increasing the area of the second emitter electrode 17, low-resistance current paths can be increased. This is because, in the operation region 8 under the second emitter electrode 17, collector currents are drawn substantially vertically upward through current paths such as CP1 and CP2. In addition, since the area of the operation region 8 under the second base electrode 16 is decreased, high-resistance current paths such as CP3 can be decreased. Here, through the high-resistance current paths, collector currents flow from the operation region 8 through the thin first emitter electrodes 7 in their extending direction, and are then drawn upward to the second emitter electrode 17.

Figure 4A:
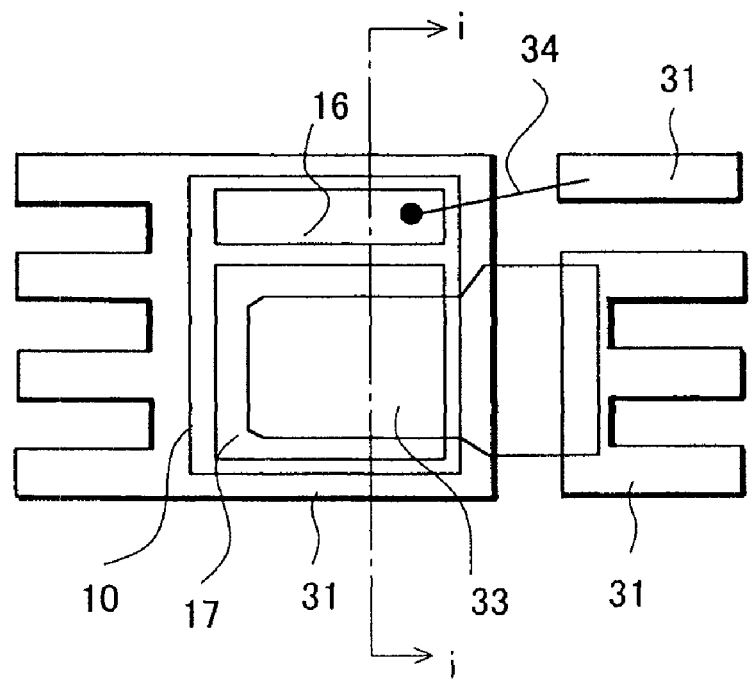
FIGS. 4A and 4B are a plan view and a cross-sectional view, respectively, for illustrating the preferred embodiment of the invention.
Figure 4B:
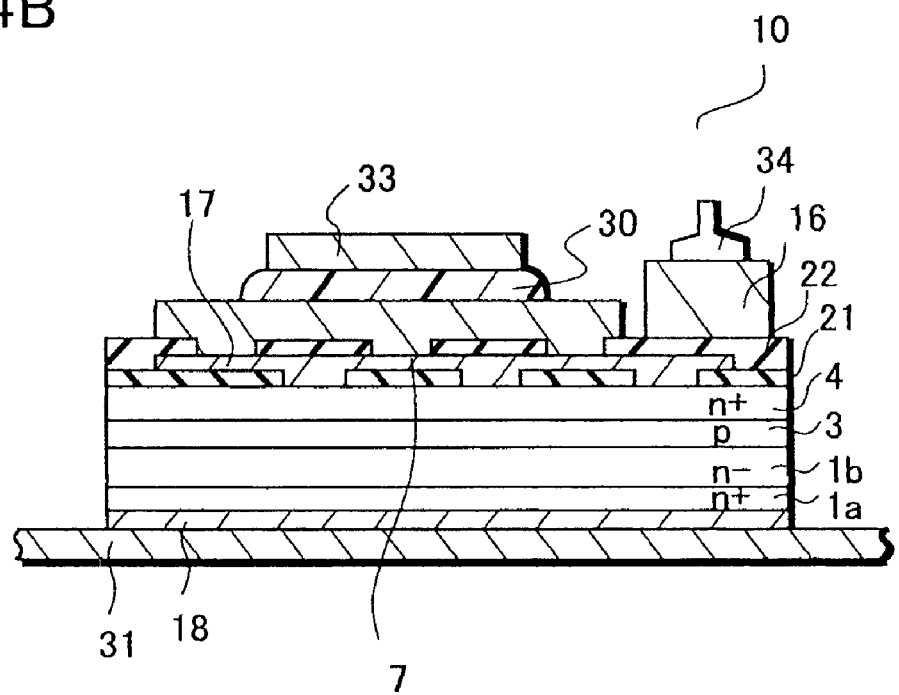

FIGS. 4A and 4B show external connections. FIG. 4A is a plan view, and FIG. 4B is a cross-sectional view taken along the line i-i in FIG. 4A.

A collector electrode 18 is formed on the bottom surface of the semiconductor device 10, and is fixed on the header of a stamped frame 31 made, for example, of copper (Cu). A conductive adhesive (solder, silver (Ag) paste, or the like) 30 is applied on the top surface of the second emitter electrode 17, and a metal plate 33 is fixed at one end on the conductive adhesive 30. The metal plate (copper (Cu), for example) 33 is fixed at the other end on the frame 31. A bonding wire 34 made, for example, of gold (Au) is fixed at one end on the second base electrode 16, and is fixed at the other end on the frame 31.

In this embodiment, even though transistors each having a two-layer electrode structure are employed, the top surface of the second emitter electrode 17 has favorable flatness. Accordingly, fixation failure of the metal plate 33 to be fixed on the top surface of the second emitter electrode 17 can be avoided. This is because the emitter contact holes CH2 formed under each of the first emitter electrodes 7 and the emitter through holes TH2 formed on the first emitter electrode 7 are arranged so as not to overlap each other. This arrangement increases the flatness of the surface of the second emitter electrode 17 compared with the conceivable solution (FIG. 8B) in which the emitter contact holes CH2' and the emitter through holes TH2' are arranged to overlap each other.

FIGS. 5A to 5C are cross-sectional views for illustrating the above effects. FIG. 5A is a cross-sectional view taken along the line g-g in FIG. 3A, and FIG. 5B is a cross-sectional view taken along the line h-h in FIG. 3A. FIG. 5C is a cross-sectional view of a portion including a first emitter electrode in the conventional semiconductor device. FIG. 5C is the same view as FIG. 8B.

As shown in FIG. 5A, at places where the emitter contact holes CH2 are formed, no emitter through hole TH2 is formed on each first emitter electrode 7. Accordingly, a portion, located on each of the emitter contact holes CH2, of the first emitter electrodes 7, the second insulating film 22 and the second emitter electrode 17 are influenced by only a level difference d1 (level difference corresponding to the thickness of the first insulating film 21) due to the emitter contact hole CH2.

As shown in FIG. 5B, at places where the emitter through holes TH2 are formed on each first emitter electrode 7, no emitter contact hole CH2 is formed. Accordingly, a portion, located on each of the emitter through holes TH2, of the second emitter electrode 17 is influenced by only a level difference d2 (level difference corresponding to the thickness of the second insulating film 22) due to the emitter through hole TH2.

On the other hand, as shown in FIG. 5C, in the conceivable solution structure (refer to FIGS. 7A and 7B), the emitter contact holes CH2' and the emitter through holes TH2' for each first emitter electrode 7 are arranged to overlap each other. Accordingly, if the thicknesses of the first insulating film 121 and the second insulating film 122 are the same as those of the first insulating film 21 and the second insulating film 22 of this embodiment, the top surface of the second emitter electrode 117 is more uneven, since the level difference d3 of the overlapped portion is a sum (level difference d3) of the level difference d1 of the emitter contact hole CH2' and the level difference d2 of the emitter through hole TH2'. This causes a problem of reducing the wettability of the top surface of the second emitter electrode 117 for solder used for fixing the metal plate.

According to this embodiment, unevenness of the top surface of the second emitter electrode 17 is caused by only the level difference d2 or the level difference d1. In other words, the top surface of the second emitter electrode 17 has at most the level difference d2, which is smaller than the conceivable solution level difference d3. Having favorable flatness, the top surface of the second emitter electrode 17 is prevented from having poor solder wettability and thus allows the metal plate 33 to be reliably fixed thereon.

Accordingly, non-uniform current density of the entire chip is solved. As a result, the risk of a thermal runaway is reduced and thus the ASO is increased in size. Furthermore, activation failure of the cells can be suppressed, and hence the further increase in resistance components due to the presence of the non-operating cells can be avoided.

Though this embodiment has been described taking npn type bipolar transistors as an example, the present invention can be implemented using pnp type bipolar transistors, which are of a reversed conduction type, and the same effect can be obtained even in this case.

According to the present invention, the following effects can be obtained.

First, unevenness of the top surface of the second emitter electrode can be reduced by arranging the emitter contact holes formed under the first emitter electrodes and the emitter through holes formed on the first emitter electrodes so as not to overlap each other. Accordingly, the top surface of the second emitter electrode is prevented from having poor solder wettability for conductive adhesive such as solder used when the metal plate serving as an external connection is fixed thereon.

There was a problem of causing a large level difference in the top surface of the second emitter electrode formed above the first emitter electrodes because the emitter contact holes under the first emitter electrodes and the emitter through holes on the first emitter electrodes overlap each other. Because of the large level difference, the top surface of the second emitter electrode has poor solder wettability, so that the solder cannot be applied evenly on the entire top surface when the metal plate serving as the external connection is fixed thereon.

However, according to the present embodiment, since the flatness of the top surface of the second emitter electrode is improved, the surface has favorable solder wettability and thus allows the metal plate to be favorably fixed thereon.

In addition, since the metal plate serving as the external connection is fixed on the second emitter electrode, resistance can be decreased compared to the device in which bonding wires are used as the external connection.

Second, the total area of the first emitter electrodes arranged under the plate-like second emitter electrode can be increased by making the area of the second emitter electrode larger than the area of the second base electrode. Thereby, the region having current paths of a low resistance value can be increased, and thus concentration of current density can be suppressed. Accordingly, the current density of a chip can be made uniform, and thus the risk of thermal runaway and the size reduction of ASO can be prevented.

In addition, since the current density is diffused, the number of cells that are not activated when the semiconductor device is turned on is reduced, and thereby current concentration and increase in resistance components that are caused by the presence of the non-operating cells can be avoided.

Third, the same ASO size and resistance value as the conventional art can be achieved in a smaller chip.

What is claimed is:

1. A semiconductor device comprising:
   a semiconductor substrate of a first general conductivity type configured to operate as a collector region;
   a base region of a second general conductivity type formed on the substrate;
   an emitter region of the first general conductivity type formed in a surface portion of the base region to form a lattice pattern so that islands of the base region are defined in the surface portion by the lattice pattern as a matrix in plan view of the semiconductor device;
   a first insulating film disposed on the emitter region and the islands of the base region and having a plurality of base contact holes standing on corresponding islands of the base region and a plurality of emitter contact holes standing on the emitter region;
   a plurality of first base electrodes of a strip form, each of the first base electrodes being disposed on and in contact with a column of the islands of the matrix through corresponding base contact holes;
   a plurality of first emitter electrodes of a strip form, each of the first emitter electrodes being disposed on and in contact with the emitter region through corresponding emitter contact holes;
   a second insulating film disposed on the first base electrodes and the first emitter electrodes and having a plurality of base through holes standing on base contact holes that are located at ends of the columns of the matrix and a plurality of emitter through holes that do not overlay the emitter contact holes in the plan view of the semiconductor device;
   a second base electrode disposed on the second insulating film so as to overlay the base through holes and be electrically in contact with the first base electrodes through the base through holes;
   a second emitter electrode disposed on the second insulating film so as not to overlap the base through holes and be electrically in contact with the first emitter electrodes through the emitter through holes, the second base electrode being smaller than the second emitter electrode.

2. The semiconductor device of claim 1, further comprising a metal plate fixed on the second emitter electrode with a conductive adhesive.

3. The semiconductor device of claim 1, wherein each of the first base electrodes is in contact with all of the islands of the base region in a corresponding column of the matrix.

4. The semiconductor device of claim 1, wherein an area of the second base electrode is not more than a third of an area of the second emitter electrode.

5. The semiconductor device of claim 2, wherein the conductive adhesive comprises a solder or a silver paste.

* * * * *